United States Patent
Cabral, Jr. et al.

(10) Patent No.: US 7,176,116 B2
(45) Date of Patent: Feb. 13, 2007

(54) HIGH PERFORMANCE FET WITH LATERALLY THIN EXTENSION

(75) Inventors: Cyril Cabral, Jr., Ossining, NY (US); Omer H. Dokumaci, Wappingers Falls, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/074,223

(22) Filed: Mar. 7, 2005

(65) Prior Publication Data
US 2005/0148142 A1 Jul. 7, 2005

Related U.S. Application Data

(62) Division of application No. 10/605,769, filed on Oct. 24, 2003, now Pat. No. 6,933,577.

(51) Int. Cl.
*H01L 21/3205* (2006.01)
*H01L 21/4763* (2006.01)
*H01L 21/31* (2006.01)
*H01L 21/469* (2006.01)

(52) U.S. Cl. ............... 438/586; 438/592; 438/587; 438/778

(58) Field of Classification Search ........... 438/778, 438/280, 588, 585, 305, 586–587, 231
See application file for complete search history.

(56) References Cited

U.S. PATENT DOCUMENTS

| | | | |
|---|---|---|---|
| 4,788,160 A | 11/1988 | Havemann et al. | |
| 4,876,213 A | 10/1989 | Pfiester | |
| 5,397,909 A * | 3/1995 | Moslehi | 257/383 |
| 5,757,045 A | 5/1998 | Tsai et al. | |
| 6,040,606 A | 3/2000 | Blair | |
| 6,268,633 B1 | 7/2001 | Pio et al. | |
| 6,410,967 B1 | 6/2002 | Hause et al. | |
| 6,608,354 B2 | 8/2003 | Hokazono et al. | |
| 6,617,654 B2 | 9/2003 | Oishi et al. | |
| 2002/0003273 A1 | 1/2002 | Dawson et al. | |
| 2002/0109196 A1 | 8/2002 | Fujisawa et al. | |
| 2002/0185691 A1 | 12/2002 | Cabral et al. | |
| 2003/0183881 A1 | 10/2003 | Lee et al. | |

* cited by examiner

*Primary Examiner*—Chuong Anh Luu
(74) *Attorney, Agent, or Firm*—Charles W. Peterson; H. Daniel Shnurmann (57) ABSTRACT

A field effect transistor (FET), integrated circuit (IC) chip including the FETs and a method of forming the FETs. The FETs have a device channel and a gate above the device channel with a doped source/drain extension at said each end of the thin channel. A portion of a low resistance material layer (e.g., a silicide layer) is disposed on source/drain extensions. The portions on the doped extensions laterally form a direct contact with the doped source/drain extension. Any low resistance material layer on the gate is separated from the low resistance material portions on the source/drain extensions.

20 Claims, 5 Drawing Sheets

HIGH PERFORMANCE FET WITH LATERALLY THIN EXTENSION

RELATED APPLICATION

The present application is a divisional application of U.S. patent application Ser. No. 10/605,769, filed Oct. 24, 2003 entitled "HIGH PERFORMANCE FET WITH LATERALLY THIN EXTENSION" to Cyril CABRAL et al., now issued as U.S. Pat. No. 6,933,577 B2, assigned to the assignee of the present invention and incorporated herein by reference.

BACKGROUND OF THE INVENTION

1. Field of the Invention

The present invention is related to semiconductor devices and manufacturing and more particularly to high performance field effect transistors (FETs) and methods of manufacturing high performance FETs.

2. Background Description

Typical semiconductor integrated circuit (IC) design goals include high performance and density at minimum power. To minimize semiconductor circuit power consumption, most ICs are made in the well-known complementary insulated gate field effect transistor (FET) technology known as CMOS. A typical CMOS circuit drives a purely or nearly pure capacitive load and includes paired complementary devices, i.e., an n-type FET (NFET) paired with a corresponding p-type FET (PFET), usually gated by the same signal. Performance depends upon how fast the CMOS circuit can charge and discharge the capacitive load, i.e., the circuit's switching speed. Since the pair of devices have operating characteristics that are, essentially, opposite each other, when one device (e.g., the NFET) is on and conducting (modeled simply as a closed switch), the other device (the PFET) is off, not conducting (ideally modeled as a simple open switch) and, vice versa. The switch is open, i.e., the device is off, when the magnitude of the gate to source voltage ($V_{gs}$) is less than some threshold voltage ($V_T$) with respect to its source. So, ideally, an NFET is off when its $V_{gs}$ is below $V_T$, and on, conducting current above $V_T$. Similarly, a PFET is off when its gate voltage, $V_{gs}$, is above its $V_T$, i.e., less negative, and on below $V_T$.

A CMOS inverter, for example, is a PFET and NFET pair that are series connected between a power supply voltage ($V_{dd}$) and ground (GND), both gated by the same input signal. Circuit performance is a measure of how fast both drive the same capacitive load. At one input signal state the PFET is active or on pulling the output high, with device source to drain current ($I_{sd}$) or on current ($I_{onp}$) charging the load capacitance to $V_{dd}$. At the opposite input signal state the NFET is active or on pulling the output low with device drain to source ($I_{ds}$) or on current ($I_{onn}$) discharging the load capacitance back to ground. Typically, circuit designers select devices such that the rise and fall times are equal and so, by design, $I_{on} = I_{onp} = -I_{onn}$. Device on current is related to gate, source and drain voltages and, depending upon those voltages, the device may be modeled as a voltage controlled current source or a resistor. Other types of elemental CMOS-type circuits (namely, transmission gate circuits with parallel connection of NFET and PFET and various dynamic logic circuits) have also been widely employed in modern digital circuits. Despite different styles of CMOS circuits, the basic design and operation principles can be traced using a simple inverter circuit.

Semiconductor technologies and chip manufacturing are continually advancing towards higher circuit switching frequency (circuit performance) and an increased number of transistors per given area (circuit density). To pack more function in the same area, chip feature sizes and, correspondingly, supply voltage are steadily decreasing. Generally, all other factors being constant, the active power consumed by a given unit increases linearly with switching frequency. So, unfortunately, not withstanding the decrease of chip supply voltage and capacitive load, chip active power consumption has slowly increased. In addition, as FET features have shrunk, what are collectively known as short channel effects have become pronounced resulting in a rapid increase of stand-by power consumption. Short channel effects mainly include a transistor $V_T$ reduction as the gate length is reduced. Such $V_T$ dependence on the gate length is also known as $V_T$ roll-off. Accordingly, a slight variation of transistor gate length leads to a relatively large variation of the transistor threshold voltage $V_T$ and, consequently, to a substantially increased leakage for transistors with shorter gates. Furthermore, in order to keep a gradual $V_T$ roll-off, the transistor gate insulator is generally made thinner. This, in turn, results in increased gate leakages or gate induced leakages (i.e., gate to channel, gate to source or drain and gate induced drain leakage (GIDL)). Therefore, for circuits with transistor gate length of smaller than about 100 nm, the stand-by power dissipation has become comparable to the active power dissipation. Both at the chip and system levels, cooling and packaging costs have escalated as a natural result of this increase in chip power.

High-performance FET structures are designed to reduce $V_T$ dependence on gate length while providing the highest drive current at a specified overall off or leakage current. One approach to reducing short channel effects include shallow source/drain extensions. Essentially, after patterning gates on a wafer, a shallow and high dose dopant extension implant is performed. The extension implant forms source/drain extensions and is performed independently for each type of device with the aid of block masks. Extensions may also be performed after forming a thin offset spacer for certain types of devices. After performing an extension implant, thick spacers are formed at each end of FET gates. The spacer blocks or attenuates the higher energy deep source/drain dopant implant at the areas adjacent to the gates, spacing the source/drain diffusion regions away from the gate. An activation anneal is then conducted to activate both extension and source/drain dopants. During the activation anneal the implanted extension dopants diffuse and form an overlap with gate. While, the excessive diffusion of dopants during the activation anneal is not desirable, the presence of an overlap between the gate and the source/drain extension is a requirement for a proper device operation. The extension/gate overlap can be also achieved via an angled extension implant. Accordingly, a shallow source/drain extension is formed between the deep source/drain regions and the gate. After the activation anneal, the source/drain regions are silicided to minimize series resistance within source/drain regions.

The parasitic series resistance of source/drain silicide is often so small that its contribution to the total series resistance of a typical MOSFET is considered to be negligible and not a limiting factor to the device performance. The series resistances of a typical MOSFET device which affect its performance are (1) the source/drain silicide contact resistance (between the silicide and doped silicon), (2) the resistance of the doped source/drain regions under the silicide, (3) the extension resistance, and (4) the spreading resistance between the extension and the channel. In order to minimize the extension resistance, the extensions should be made very short. A typical extension is formed as a shallow dopant region having electrical conductivity substantially lower than that of a typical silicide. A typical extension depth in a modem MOSFET devices is less than about 50 nm and could be as shallow as 10 nm. A typical total spacer thickness that separates the gate edge and the silicided region is from about 300 Å in advanced NFET devices to about 600 Å in typical NFET and PFET devices. Due to the combined effects of relatively low electrical conductivity and relatively shallow depth, an extension may introduce a substantial series resistance, thereby impeding current flow through the transistor. For this reason, the extension is made as short as possible.

A typical silicidation process begins with depositing metal such as Ni, Co, or Ti onto a clean source/drain surface, followed by heating the wafer to react metal and silicon. The unreacted metal can be easily removed by a solution of strong acid (e.g. sulfuric acid) selective to the silicide. The problem with this technique is that the silicide forms under the spacer due to the generally isotropic nature of the diffusion processes involved in intermixing silicon and metal atoms. In addition, the silicide/silicon interfaces are usually very non-uniform due to "spiking" of the silicide into the silicon beyond the boundary defined by an ideal isotropic diffusion process. The lateral "roughness" of the silicide can be considerable due to various factors which enhance silicide growth under the spacer. Examples of such enhanced silicide growth include a preferred growth of the silicide along certain crystal orientations, preferred growth of the silicide in locally stressed areas, and/or preferred growth of the silicide in areas with high concentration of silicon crystal defects. These factors present a high probability that the silicide will breach through highly-doped source/drain and extension region and come into a direct contact with the channel or transistor body, effectively degrading transistor performance and increasing leakage and power consumption. If the silicide comes into direct contact with the transistor channel, the effective contact resistance between the silicide and the channel will become very high due to a relatively low channel carrier concentration in the channel and the resultant wide Schottky barrier. Further, if the silicide comes into direct contact with the transistor body, the barrier height of resultant Schottky diode is substantially lower than that of a typical p-n junction resulting in an increased leakage and increased circuit power consumption.

If the thickness of the spacer that separates the silicided region from the gate is increased sufficiently that the probability of the silicide coming into direct contact with the transistor channel and body is low, then the series resistance of the extension is increased. High extension resistance reduces device currents and increases the resistance charging the load capacitance which degrades circuit performance. Consequently, sensitivity to external series device resistance is exacerbated.

An extremely thin (~10 Å–100 Å) highly doped region between the silicide and the channel is highly desirable. Such a thin highly doped region would reduce the silicide contact resistance to normal levels and would make the extension resistance negligible. Unfortunately, such ultra thin doped layer between the region silicide and the transistor channel has been unattainable due to the silicide breaching through the doped layer.

Thus there is a need to reduce the source/drain extension resistance and, more particularly, to minimize silicide/silicon interface roughness and prevent silicide-based electrical shorts.

SUMMARY OF THE INVENTION

It is a purpose of the invention to improve short-channel field effect transistor (FET) performance;

It is another purpose of the invention to reduce short-channel FET series resistance;

It is yet another purpose of the invention to reduce series resistance in a short-channel FETs without increasing device parasitic capacitance.

The present invention relates to a field effect transistor (FET), integrated circuit (IC) chip including the FETs and a method of forming the FETs. The FETs have a device channel and a gate above the device channel with a doped source/drain extension at said each end of the thin channel. A portion of a low resistance material layer (e.g., a silicide layer) is disposed on source/drain extensions. The portions on the doped extensions laterally form a direct contact with the doped source/drain extension. Any low resistance material layer on the gate is separated from the low resistance material portions on the source/drain extensions.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
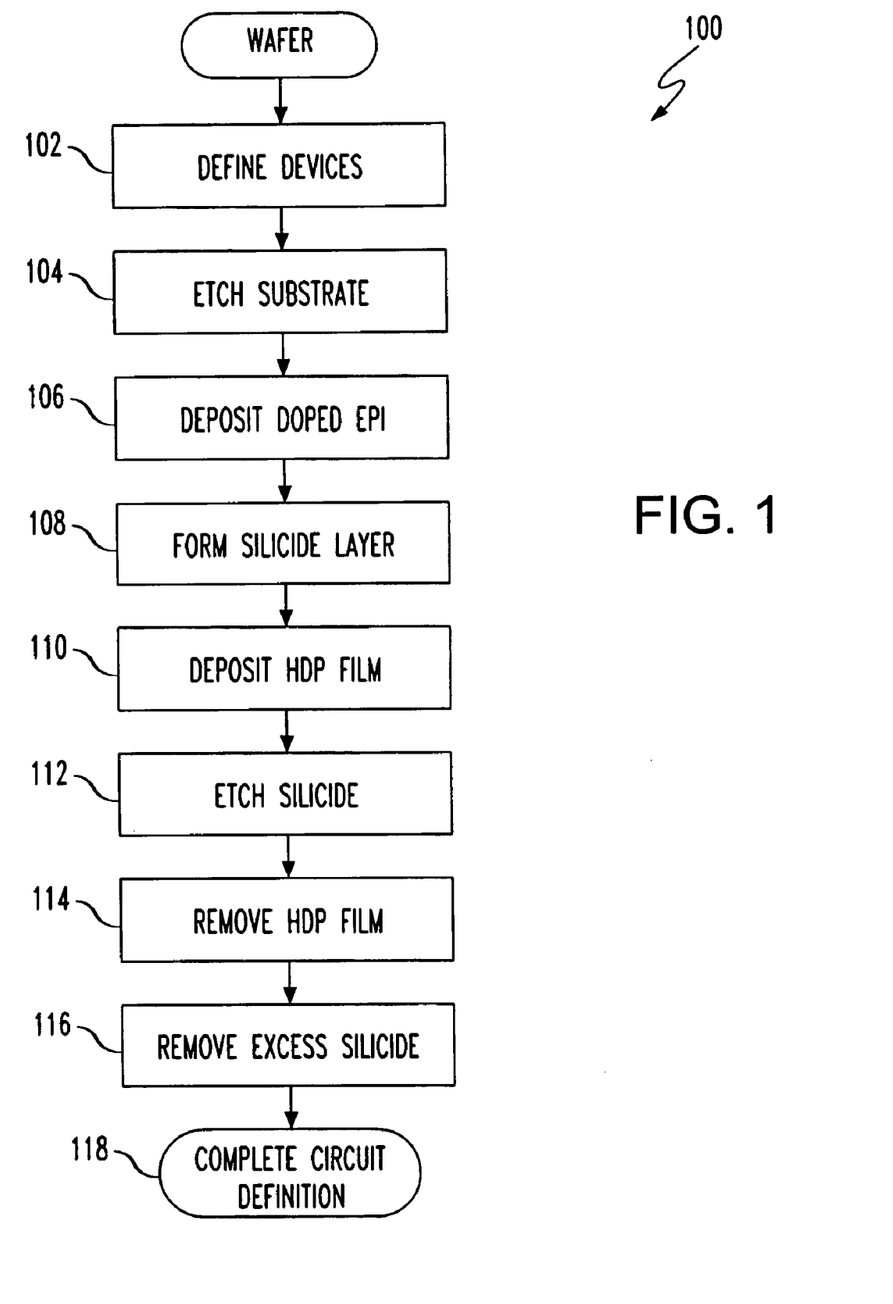
FIG. 1 shows a flow diagram example of steps for forming field effect transistors (FETs) with laterally thin extensions according to a preferred embodiment of the present invention.

Turning now to the drawings and, more particularly, FIG. 1 shows a flow diagram example 100 of steps for forming field effect transistors (FETs) with laterally thin extensions according to a preferred embodiment of the present invention. First, in step 102, device definition begins as gate electrodes are patterned on a semiconductor substrate. Preferably, the semiconductor substrate is silicon based, (e.g., silicon a silicon alloy or a combination thereof including Si, SiGe, SiC, SiGeC) although any suitable semiconductor material may be used including, but not limited to GaAs, InAs, InP or other III/V compound semiconductors. The semiconductor substrate may also include a multilayer structure in which at least the top layer thereof is a semiconductor. Illustrative examples of multilayer substrate structures include, for example, Si/SiGe, a silicon-on-insulator (SOI) or a SiGe-on-insulator (SGOI). The semiconductor substrate also includes a gate dielectric located on a surface of a semiconductor material and a gate electrode material (or gate material) located on the gate dielectric. The semiconductor substrate may also include various useful structures such as memory cells, isolation structures (e.g. isolation trenches), dopant wells, locally stressed regions, three dimensional transistor features such as fins and pillars, and buried contacts and interconnects.

The gate dielectric is formed on the surface of a semiconductor material using a suitable formation step such as for example, depositing the dielectric, a thermal oxidation, nitridation or oxynitridation. Combinations of the aforementioned processes may also be used in forming the gate dielectric. The gate dielectric is an insulating material including an oxide, nitride, oxynitride or any combination thereof. A highly preferred insulating material that may be employed in the present invention as the gate dielectric is nitrided $SiO_2$ or oxynitride. Although it is preferred to use nitrided $SiO_2$ or oxynitride as the gate dielectric material, the present invention also contemplates using insulating materials, i.e., dielectrics, which have a higher dielectric constant, k, than nitrided $SiO_2$. For example, the gate dielectric may include a oxynitride-nitride stack, a pure nitride, a high-k oxide or oxynitride or respective silicate such as $Al_2O_3$, $HfO_2$, $HfO_xN_y$, $HfSi_xO_yN_z$. The physical thickness of the gate dielectric may vary, but typically the gate dielectric has a thickness of from about 0.5 to about 20 nm, with a thickness of from about 1.0 to about 3.0 nm being more highly preferred.

Preferably, the gate material is doped polysilicon. However, the gate electrode or gate is any suitable conductive material such as an alloy of doped silicon, such as silicon-germanium ($SiGe_x$) or silicon-carbon ($SiC_x$) and/or other conductive materials including elemental metals (W, Ta, Mo, Ti, Re, Ir, Al, etc.), metal silicides ($CoSi_x$, $NiSi_x$, $WSi_x$, $TiSi_x$), metal nitrides (WN, TaN, TiN) and its alloys. The gate electrode material can be in either crystalline, polycrystalline, or amorphous form and may include multiple layers of various conducting materials.

The gate electrode material is patterned to form narrow transistor gates. As referred to herein, a narrow gate refers to the smallest geometrical feature of the gate. The patterning step is typically accomplished using well known photolithography techniques. A reactive ion etch (RIE) is typically employed to complete photolithography pattern transfer into the gate. The RIE is highly selective to the particular choice of gate insulator to stop on it. After gate etch, a thin spacer (preferably, silicon nitride and/or oxide) is provided at either end of each gate. The spacer is formed by first forming a conformal layer of a material by thermal oxidation, nitridation or known deposition methods with subsequent directional RIE etch. Optionally, the halo regions are formed, e.g., using a halo implant and optional anneal.

Next, in step 104 the surface of the substrate is selectively etched using a combination of suitable isotropic and anisotropic etches to recess exposed portions of the semiconductor substrate surface, i.e., in areas not protected by gate electrodes and adjacent spacers, below the level of interface between the gate dielectric and the substrate under the gate. Thus, preferably, the sub etch forms recesses form 30 Å to about 700 Å below the original surface level and most preferably, 30 to about 300 Å. Once recessed, the semiconductor substrate surface can be optionally undercut with a semiconductor etch to provide a small overlap between the gate electrode edges and the etched substrate surface (preferably, 10 Å–30 Å of overlap). Then, in step 106 a thin semiconductor layer (<100 Å) adjacent to the recessed semiconductor surface is doped using known doping techniques (e.g. gas phase doping) to laterally form thin (<100 Å) doped extensions which overlap gate electrode edges by 10–30 Å. Alternatively, a thin epi layer is selectively deposited and doped, preferably, with in situ doping to laterally form thin (<100 Å) doped extensions which overlap gate electrode edges by 10 Å–30 Å. In particular, the doped lateral extension layer should be made substantially thicker than the depletion width of the silicide-semiconductor Schottky diode (a typical depletion width of such diode is about 10 Å) in order to reduce the contact resistance to an acceptable level. Accordingly, a preferred thickness range of doped laterally thin extension is from about 10 Å to about 100 Å.

In step 108, a silicide layer (preferably, a silicide chosen from tungsten (W), cobalt (Co), nickel (Ni), titanium (Ti), platinum (Pt), or Erbium (Er) silicides and most preferably Wsi, NiSi or CoSi) is uniformly formed, e.g., deposited, and a smooth interface is formed with the doped semiconductor layer. After forming a thin doped region of laterally thin extensions, an optional dopant implant step can be performed to increase the depth of doped region in source/drain regions. The purpose of this optional implant is to reduce resistance to the electrical current flow from the silicide to the laterally thin extensions. Further, an optional anneal or a combination of anneals can be conducted before and/or after the optional implant to further activate the dopants in the laterally thin extension and in the implanted layer and to heal any damage caused the implant. Optional activation anneal(s) can be performed for ultra short time of less than several milliseconds and, preferably, for hundreds of microseconds to prevent excessive diffusion of dopants. Such ultra short activation anneals are well known in the art as laser or flash anneals. Additionally, optional implant damage healing anneal(s) can performed in a regular rapid thermal processor (RTP) reactor at a relatively low temperature to prevent excessive diffusion of dopants.

In the following processing steps 110–116, the silicide layer is removed from gate sidewalls and from isolation areas eliminating electrical shorts. Accordingly, in step 110, a non-conformal film is deposited on the wafer such that the film is substantially thinner on vertical walls than on horizontal surfaces. One example of such non-conformal deposition method is a high density plasma (HDP) deposition of silicon oxide from silane ($SiH_4$) and oxygen ($O_2$) based plasmas. HDP ions are accelerated towards the substrate increasing the oxide deposition rate on horizontal surfaces. Another example of non-conformal deposition methods is a spin-on deposition technique of various polymers such as antireflective coating (ARC) materials and photoresists as well as spin-on glasses. A short isotropic etch is generally required after a non-conformal deposition step to remove any material deposited onto gate sidewalls. In the case of non-conformal HDP deposition of $SiO_2$, the isotropic etch is conducted in a solution of hydrofluoric acid. Etch duration is selected to remove all oxide from gate sidewalls while leaving a thick oxide layer on all horizontal surfaces. Then, in step 112 exposed vertical portions of the silicide are removed, e.g., etched away using a dry etch with a large isotropic component, for instance, leaving behind only the horizontal portions of the silicide on the source/drain extensions from the channel. In order to ease silicide removal from gate sidewalls, the silicide can be optionally damaged with a high-dose angled implant of large ion (e.g. As+, Xe+, Ar+, Si+ and Ge+). The silicide removal process can be either selective or non-selective to the non-conformal material covering horizontal surfaces. In the case of non-selective silicide removal, the thickness of the non-conformal material covering horizontal surfaces should be larger than the silicide thickness. In step 114 the remainder of the non-conformal film is removed leaving silicide on the extensions and on the gates. Then, in step 116 the silicide is masked using well known photolithography techniques and removed from the isolation regions using directional reactive ions etching (RIE). The remaining silicide on the device gates and source/drain extensions provides contacts for later metallization steps.

Finally, in step 118, device processing continues through typical semiconductor manufacturing middle of the line (MOL) and back end of the line (BEOL) processing steps to form integrated circuit (IC) chips. Preferably, the MOL and BEOL processes are conducted at low temperature to prevent uncontrollable reaction between the silicide layer and the laterally thin doped extension. For example, in advanced CMOS fabrication, all MOL and BEOL processes may be conducted at or below about 400° C., which is a low enough temperature to avoid generating undesirable and uncontrollable reactions between silicide and doped extensions. Also, if all thermal processes of MOL and BEOL are conducted at such a low temperature (e.g. at or below 400° C.), a metal layer can be used as an alternative to the silicide layer. A combination of a silicide and other metallic layer can also be used in place of the silicide layer described above. Accordingly, any highly-conductive layer may be provided adjacent to the laterally thin extension such that the layer exhibits a metallic type conductivity with Fermi energy higher than about 0.3 eV. In contrast, a typical Fermi energy of a highly-doped semiconductor is lower than 0.1 eV. Examples of materials with metallic type conductivity include elemental metals (e.g. W, Co, Ti, Re, Ir, etc.) and certain metallic compounds such as metal-nitrides (e.g. WN, TiN, TaN, etc.), metal carbides, metal borides, and various metallic ternary and quaternary compounds.

Typically, MOL processing steps may include: removing the thin spacer; forming of additional spacers around the gates; forming additional conductive areas away from the gate using the same or a different type of low resistance material (e.g. silicide); forming insulating and encapsulating liners around entire transistor structure; and various gate replacement schemes. Although these MOL process steps may considerably change the spacer structure, the gate composition, and the source/drain structure, a preferred embodiment thin source/drain extension with adjacent highly conductive material and appurtenant transistor channel remains substantially the same.

FIGS. 2A–2G show an example of forming a single device according to the example 100 of FIG. 1 in a cross section of a device region 120 with thin lateral extensions on a semiconductor substrate 122. In step 102 for a bulk substrate, for example, wells and isolation regions are formed to define device regions 120. A 5–50 Å thick gate insulator layer 124, preferably oxide or oxynitride, is thermally formed on the semiconductor substrate 122 using oxidation, nitridation or oxynitridation. Optionally, gate insulator 124 may be a high-k material such as an oxide of Zirconium ($ZrO_2$), Aluminum ($Al_2O_3$) or Hafnium ($HfO_2$), formed on the semiconductor substrate 122 using chemical vapor deposition (CVD), plasma-assisted CVD, atomic layer CVD (ALCVD), evaporation or chemical solution deposition. Next, a 300–1500 Å thick gate material layer is deposited using any suitable deposition technique, such as for example, CVD, plasma-assisted CVD, evaporation, plating, chemical solution deposition. Preferably, the gate material is polysilicon or amorphous silicon. Optionally, the gate material may be a metal or a metal silicide. After forming the gate material layer, gates 126 are patterned, e.g., depositing photoresist, lithographically patterning the photoresist and etching the gate material layer through the gate insulator layer 124 to the surface of the semiconductor substrate 122. Preferably, the gate material layer is dry etched with a suitable conventional dry etching process, such as a reactive-ion etch (RIE) or plasma etching. After defining gates 126, a 10–100 Å sidewall spacer layer, preferably, a uniform thickness nitride layer is conformally deposited using, for example, CVD or plasma-assisted CVD. Optionally, the sidewall spacer layer may be an oxide layer or a combination of nitride and oxide layer. Then, the sidewall spacer layer is anisotropically etched using a conventional dry etching process such as RIE or plasma etching to remove horizontal portions of the sidewall space layer, leaving 10–100 Å wide sidewall spacers 128 on opposite sides of gates 126.

Figure 2A:
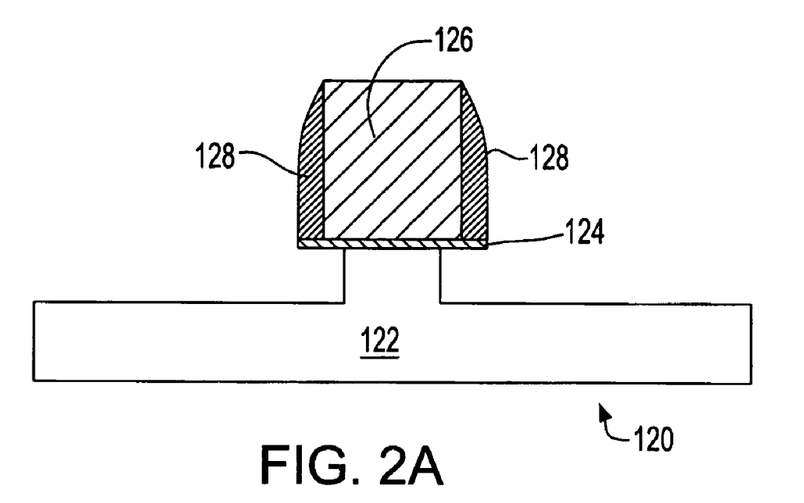
FIGS. 2A–2G show a cross section of a device region through the steps of forming FETs with laterally thin extensions on a semiconductor substrate.

It should be noted that n-type FETs (NFETs) and p-type FETs (PFETs) are formed substantially identically in any order with device terminals and regions being doped with a suitable dopant for the particular device type. In one implant step, the particular dopant is implanted at the device regions using a halo implant to control device short channel $V_T$ rolloff. Other device implant steps include well definition implants including $V_T$ adjust implants and optional deep source drain implants. Optionally, the halo implant may be done prior to forming sidewall spacers 128. Preferably and depending upon device type, a $10^{13}$–$10^{14}$/cm² dose of arsenic (As), boron (B), boron difluoride ($BF_2$) or phosphorous (P) is implanted at a tilt angle of 10–30 degrees with a halo energy of 1–100 KeV. Preferably, the halo dopant is activated with a 50 microsecond to 10 second (50 µs to 10s) anneal at 900 to 1410° C., completing step 102.

Figure 2B:
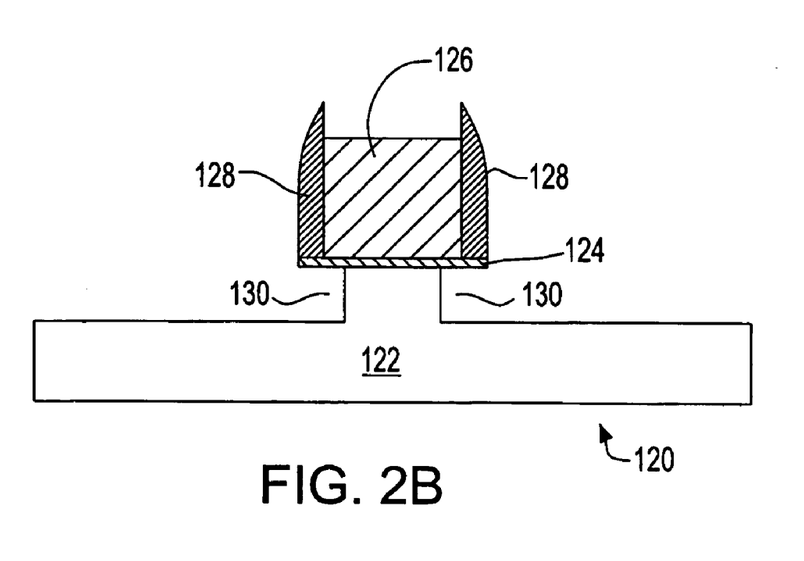

Next, in step 104 recessed regions 130 are formed as described hereinabove by selectively etching the surface of semiconductor substrate 122. A combination of suitable isotropic and anisotropic etches are used to recess exposed portions of the semiconductor substrate surface, i.e., in areas not protected by gate electrodes 126 and adjacent spacers, below the level of interface between the gate dielectric and the substrate under the gate. Once recessed, the semiconductor substrate surface can be optionally undercut with a semiconductor etch to provide a small overlap between the gate electrode edges and the etched substrate surface (preferably, 10 Å–30 Å of overlap).

Alternatively, if the surface of a semiconductor substrate 122 is a single crystal semiconductor (e.g., silicon), the surface is converted to a thin amorphous layer prior to the surface recess step 104. In one example, the silicon surface is amorphized by implanting a $10^{14}$–$10^{16}$/cm² dose of large ion (e.g. As+, Xe+, Ar+, Si+ and Ge+) into the surface at 1–50 KeV. First, the exposed gate insulator is stripped with depleted hydrofluoric acid, for example. Then, the underlying amorphous silicon is etched away using an etchant that is selective to the underlying crystalline silicon substrate 122 and the gate insulator 124. This etching forms recessed regions 130 on either side of, and encroaching under, the gates 126. Addition of such preamorphization followed by a selective etch of amorphized layer allows for a precise control of the recess. Optionally, once recessed, the semiconductors substrate surface can be undercut with a semiconductor etch to provide a small overlap between the gate electrode edges and the etched substrate surface (preferably, 10 Å–30 Å of overlap). Such explicit undercutting process can employ a very slow isotropic semiconductor etch to laterally undercut the semiconductor. Alternatively, a semiconductor etch which etches different semiconductor crystallographic planes with different speeds can be used to expose a certain crystallographic plane (e.g. (111) plane of silicon crystal) which has an angle of less than 90 degrees between such slow etching plane and the substrate surface. An additional advantage of such crystal-plane-dependent undercut is that the (111) silicon plane is more stable against formation of surface silicon oxide than other crystallographic planes. Presence of native oxide on recessed and optionally undercut semiconductor surfaces is highly undesirable because it can interfere with doping and epitaxial processes.

After forming the recessed regions 130, a source/drain region can be formed that will be directly under exposed horizontal surfaces of the substrate. The purpose of this optional implant is to reduce resistance to electrical current flow from the silicide to the laterally thin extensions. Further, an optional anneal or a combination of anneals can be conducted before and/or after the optional implants to further activate the dopants in the laterally thin extension and in the implanted layer and to heal any damage caused the implant. The optional activation anneal(s) can performed for ultra short time of less than several milliseconds and, preferably, for hundreds of microseconds to prevent excessive diffusion of dopants. Such ultra short activation anneals are known in the art as laser or flash anneals. The optional implant damage healing anneal(s) can be performed in a regular rapid thermal processor (RTP) reactor at a relatively low temperature to prevent excessive diffusion of dopants.

Figure 2C:
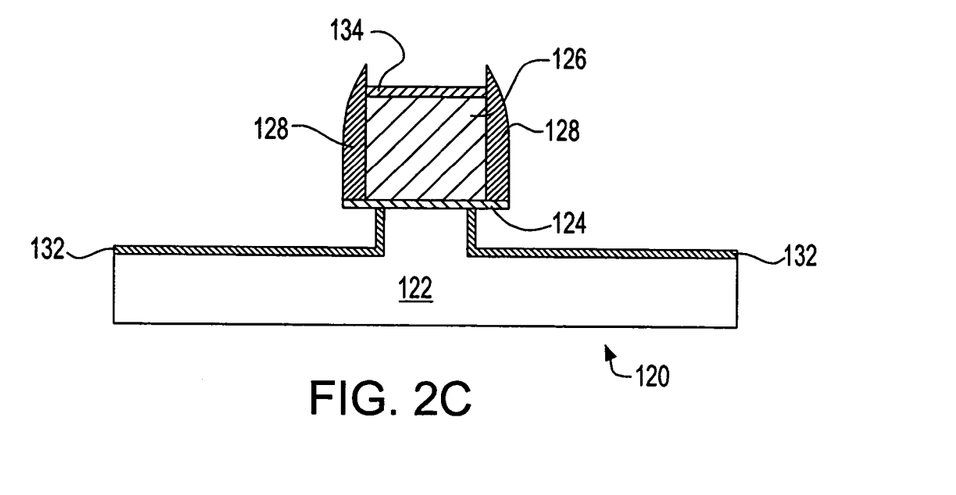

Next, as shown in FIG. 2C in step 106 a thin semiconductor layer (<100 Å) adjacent to the recessed semiconductor surface is doped using known doping techniques (e.g. gas phase doping) to form thin (<100 Å) laterally doped extensions which overlap gate electrode edges by 10 Å–30 Å. In one example, the gas phase doping step is conducted in the gas ambient, with P dopant gases such arsine ($AsH_3$) and phosphine ($PH_3$) for n-type As; and, N dopant diborane ($B_2H_6$) gas for p-type boron. A typical temperature of the gas phase doping process is from about 500° C. to about 1100° C. A typical duration of the gas phase doping process is from about 1 second to about 1 hour depending on the desired diffusion length. Normally, one would select a relatively high process temperature and short process time in order to introduce high concentration of dopants (>5·$10^{19}$ $cm^{-3}$) within a thin surface layer with sharp profile. Prior to the gas phase doping, the surface of semiconductor is cleaned to remove any material present on exposed surfaces (e.g. native oxide in the case of silicon semiconductor). The cleaning step may include hydrofluoric acid based wet clean, a semiconductor surface passivation with easily removable absorbent step, and/or an in-situ bake in a reducing atmosphere (e.g. $H_2$) at reduced pressure. Because of high processing temperature, a typical photoresist (PR) based block masks employed to selectively introduce different types of dopants into NFET and PFET cannot be used at this step. A hard mask that can withstand high processing temperature is needed to selectively introduce dopants in various types of devices. In one example, a thin silicon nitride layer similar to that of the spacer material is first disposed over entire substrate. Then, a PR based mask opens desired areas and blocks other regions. A directional RIE step is then performed to form a thin gate spacer in the open areas while leaving PR in other areas. After PR strip, the selected devices have a thin gate spacer with exposed horizontal semiconductor surface while other devices are covered with a hard mask. The rest of the processing to form laterally thin extension in the selected devices proceeds as described hereinabove.

Alternatively in step 106, a thin (<100 Å) doped epi (e.g., doped silicon) layer is selectively grown, in-situ on exposed silicon and oxide surfaces to form device extension regions 132 and upper gate surface layer 134. The epi growth can be repeated using a hard mask approach as described above to form different types of extensions for various devices (e.g. NFET and PFET). In the case of several consecutive epitaxial growth steps, the epitaxy is performed selective to the spacer/hard mask material such that no silicon is formed on the hard mask. Selective silicon epitaxy is well known in the art. Preferably, the thin doped epi layer is grown from a silicon tetrachloride or silane ($SiH4$) gas mixtures at 400–900° C. in the presence of a suitable dopant gas, such as diborane ($B_2H_6$) gas for p-type boron dopant or phosphine ($PH_3$) or arsine ($AsH_3$) gas for n-type phosphorus and/or arsine dopants. Alternatively, the growth source may be a mixture of dichlorosilane and hydrochloric acid instead of silicon tetrachloride. So, for a typical CMOS IC, for example, PFET device regions are masked using a hard mask and in-situ n-type doped epi is grown in NFET extension regions 132 and on the upper surface of NFET gates 134; and, then, NFET devices are masked using a hard mask and in-situ p-type doped epi is similarly grown in PFET extension regions 132 and the upper surface of PFET gates 134. So, first in this example, a hard mask layer such as an oxide layer or a nitride layer is formed over the wafer and PFET device areas are masked, lithographically, removing hard mask material and exposing NFET areas. Then, an in-situ n+ doped epi is grown on NFET extension regions 132 and the upper gate surfaces 134. The hard mask is removed and another hard mask layer is formed and masked to remove the hard mask material and exposing the PFET areas. An in-situ p+ doped epi is grown on PFET extension regions 132 and the upper gate surfaces 134 and, optionally, the remaining hard mask material is removed. One example of such mask is a thin layer of silicon nitride. Such hard mask can be easily and selectively etched using a solution of heated phosphoric acid. Of course, it is understood that PFETs may be formed first, followed by NFET formation.

Alternatively, device extension regions 132 and gate upper surfaces 134 may be doped in step 106, for example, with what is known in the art as solid source doping. Doped oxide films (first n-doped, followed by p-doped or vice versa) are selectively deposited after etching silicon in step 104 and annealed using either an RTP or laser/flash anneal system. The thermal budget of the anneal should be such that the lateral junction depth is less than 100 Å and more particularly, 10–100 Å. After RTA the doped oxide film is selectively removed using a solution of hydrofluoric acid. In addition, the extensions may be formed by ion implant and laser annealing; by a low energy angled implant into an oxide and out diffusion from the oxide; or, by a very low energy angled implant with a very short anneal.

Figure 2D:
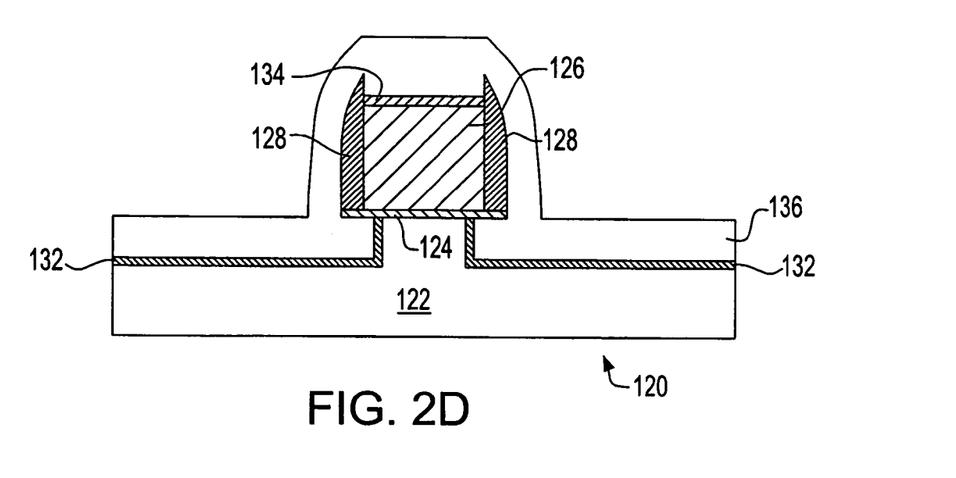

Continuing to step 108 in FIG. 2D, as described hereinabove, a low resistance silicide layer 136, preferably a silicide chosen from W, Co, Ni, Ti, Pt, or Er silicides and most preferably Wsi, NiSi or CoSi, is deposited using a suitable deposition technique such as CVD, uniformly forming a 10–500 Å thick layer on the wafer The silicide layer 136 forms a low resistance contact for upper (subsequently formed) metal levels (not shown) with device extension regions 132 and gate upper surfaces 134.

Figure 2E:
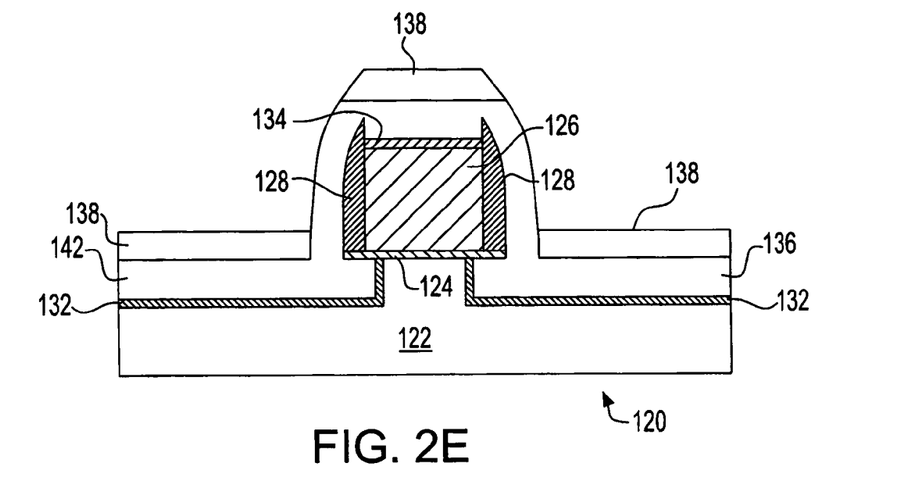

Next as described hereinabove for step 110 and as shown in FIG. 2E using, for example, HDP deposition a 100–1000 Å masking (oxide) layer or film 138 is non-conformally deposited on the wafer. Any film 138 forming on vertical surfaces of the silicide layer 136 is etched off. So, portions of the silicide layer 136 along the sides of gates 126 are substantially free of the film 138 and are exposed, while horizontal portions on the device extension regions 132 and the gate upper surfaces 134 remain covered by the film 138.

Figure 2F:
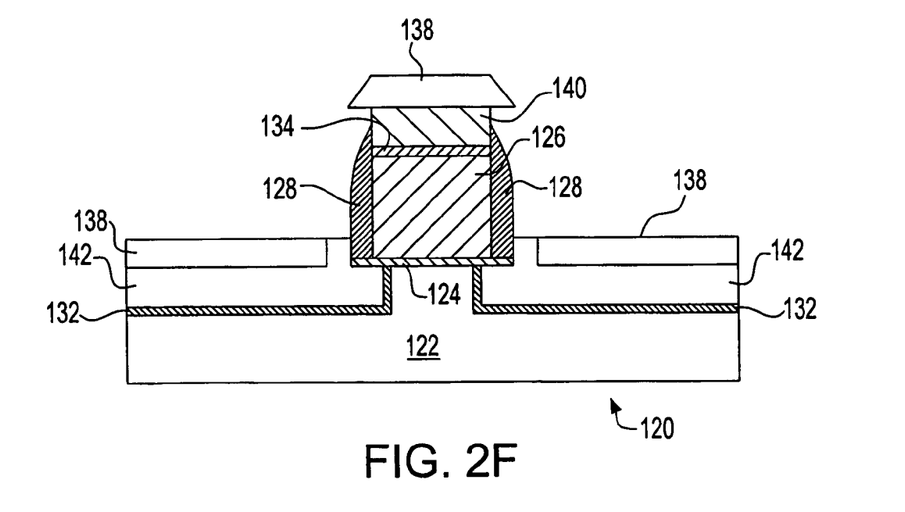
Figure 2G:
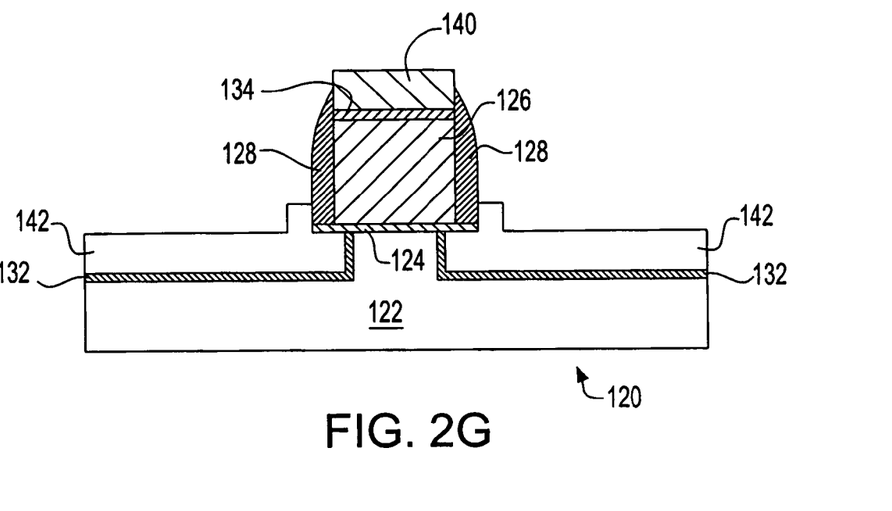

As described hereinabove for step 112–116 and as shown in FIGS. 2F and 2G, exposed portions silicide layer 136 are removed to re-expose the nitride sidewall spacers 128. Also, gate silicide 140 at the top of the spacers 128 has been separated/isolated from source/drain extension silicide 142 at the bottom of the spacers. If the gate spacer surface material is something other than oxide, then, as shown in FIG. 2G, the film 138 may be removed as described hereinabove for step 114, exposing gate silicide 140 and source/drain extension silicide 142, which provides contacts for subsequent metallization. Otherwise, if the gate spacer surface material is oxide, then step 114 is skipped and the film 138 is left in place. Finally, as described hereinabove for step 116 excess horizontal silicide (not shown) is removed, e.g., from the isolation regions. Thereafter, in step 118 device processing continues as described hereinabove through typical IC chip metallization and pacification using suitable semiconductor manufacturing MOL and BEOL processing steps.

Advantageously, a deposited silicide insures a uniform, very smooth silicide/silicon interface, thereby avoiding uncontrollable silicide formation under the spacer or gate electrode and silicide spiking into the silicon. This prevents the silicide from otherwise punching through the doped thin lateral extension. As a further advantage, because the boundary between silicide and semiconductor doped layer is fixed by etching and deposition steps for preferred embodiment devices, extension resistance is minimized because the silicide/silicon interface is formed much closer to device junctions than previously, i.e., the silicide/silicon interface is spaced from the lateral junction from about 10—to about 100 Å.

Additionally, the highly doped extension layer can be made thinner than the charge carrier de Broglie wavelength in semiconductor (at room temperature the electron de Broglie wavelength in silicon is about 170 Å, for instance). Because of a wave nature of charged carriers (electrons or holes) at such small special scale, a portion of the silicide carrier wave function can couple through the extension into the transistor channel. Such wave function coupling can also be interpreted as an injection of silicide carriers into the transistor channel through such thin extensions without interacting with semiconductor lattice and little or no scattering. Because silicide carriers carry a large "Fermi" momentum or, in other words, travel with a characteristic "Fermi" velocity, such momentum injection from the silicide into the channel can lead to a higher charge transfer rate through the transistor or, equivalently, to a higher "on" current. Such momentum injection can only happen at very small distances of less than the de Broglie wavelength of semiconductor carriers.

While the invention has been described in terms of preferred embodiments, those skilled in the art will recognize that the invention can be practiced with modification within the spirit and scope of the appended claims.

What is claimed is:

1. A method of forming an integrated circuit (IC) on a semi conductor substrate, said method comprising the steps of:
    a) etching a semiconductor surface in source/drain areas;
    b) forming a source/drain extension in etched said source/drain areas;
    c) forming a low resistance layer on said semiconductor surface, said low resistance layer forming on each said source/drain extension; and
    d) selectively removing vertical portions of said low resistance layer, said low resistance layer being removed from device gate sidewalls and remaining on device gates and each said source/drain extension.

2. A method of forming an IC as in claim 1, wherein before the etching step (a) device gates are formed comprising the steps of:
    a1) forming a gate dielectric layer on said semiconductor surface;
    a2) depositing a gate material layer on said gate dielectric layer;
    a3) patterning said gate material layer and said gate dielectric layer, gates being formed on gate dielectric; and
    a4) forming spacers along gate sidewalls, said spacers being less than 100 Å thick.

3. A method of forming an IC as in claim 1, wherein the semiconductor surface is a silicon surface on an SOT wafer and the etching step (a) etches into said silicon surface to an underlying insulating layer.

4. A method of forming an IC as in claim 1, wherein the semiconductor surface is a surface of a silicon wafer and the etching step (a) comprises converting the silicon surface to amorphous silicon and removing said amorphous silicon.

5. A method of forming an IC as in claim 4, wherein converting the silicon surface to amorphous silicon comprises implanting a $10^{14}$–$10^{15}$/cm$^2$ dose of large ions at 1–50 KeV into said silicon surface, said large ions having an atomic number at least that of silicon.

6. A method of forming an IC as in claim 5, wherein said large ions are ions of a material selected from the group of materials consisting of arsenic (As+), xenon (Xe+), argon (Ar+), silicon (Si+) and germanium (Ge+).

7. A method of forming an IC as in claim 1, wherein forming the source/drain extension in step b comprises depositing an in-situ doped silicon layer, forming the in-situ doped silicon layer comprising the steps of:
    i) forming a mask over said device regions defined for a first device type;
    ii) selectively depositing in-situ doped silicon, doped for a second device type;
    iii) forming a mask over said device regions defined for said second device type; and
    iv) selectively depositing in-situ doped silicon, doped for said first device type.

8. A method of forming an IC as in claim 1, wherein forming the source/drain extension in step b comprises the steps of:
    i) selectively depositing a first doped oxide on said etched semiconductor surface, doped for a first device type;
    ii) selectively depositing a second doped oxide on said etched semiconductor surface, doped for a second device type; and
    iii) annealing with a rapid thermal anneal such that lateral junction depth is less than 100 Å.

9. A method of forming an IC as in claim 1, wherein the low resistance layer is a silicide layer and the step c of forming the silicide layer comprises the steps of:
    i) forming a suicide layer on said semiconductor substrate;
    ii) forming a non conformal masking layer on said silicide layer;
    iii) removing portions of said masking layer from vertical silicide layer surfaces; and
    iv) removing exposed portions of said silicide layer.

10. A method of forming an IC as in claim 9, wherein said silicide layer is deposited using chemical vapor deposition (CVD) to deposit a 50–500 Å thick suicide layer at 250–500° C.

11. A method of forming an IC as in claim 1, wherein the low resistance layer is a metal layer and the step c of forming the metal layer comprises the steps of:
  i) forming a metal layer on said semiconductor substrate;
  ii) forming a non conformal masking layer on said metal layer;
  iii) removing portions of said masking layer from vertical metal layer surfaces; and
  iv) removing exposed portions of said metal layer.

12. A method of forming an IC as in claim 1, further comprising the step of:
  e) removing excess said low resistance layer material.

13. A method of forming an integrated circuit (IC) on a semiconductor substrate, said method comprising the steps of:
  a) etching into a silicon surface in source/drain areas and etching in an angled undercut following a silicon (111) crystallographic plane;
  b) forming a source/drain extension in etched said source/drain areas;
  c) forming a low resistance layer on said semiconductor surface, said low resistance layer forming on each said source/drain extension; and
  d) selectively removing vertical portions of said low resistance layer, said low resistance layer being removed from device gate sidewalls and remaining on device gates and each said source/drain extension.

14. A method of forming an IC as in claim 13, wherein before the etching step (a) device gates are formed comprising the steps of:
  a1) forming a gate dielectric layer on said semiconductor surface;
  a2) depositing a gate material layer on said gate dielectric layer;
  a3) patterning said gate material layer and said gate dielectric layer, gates being formed on gate dielectric; and
  a4) forming spacers along gate sidewalls, said spacers being less than 100 Å thick.

15. A method of forming an IC as in claim 13, wherein forming the source/drain extension in step (b) comprises depositing an in-situ doped silicon layer, forming the in-situ doped silicon layer comprising the steps of:
  i) forming a mask over said device regions defined for a first device type;
  ii) selectively depositing in-situ doped silicon, doped for a second device type;
  iii) forming a mask over said device regions defined for said second device type; and
  iv) selectively depositing in-situ doped silicon, doped for said first device type.

16. A method of forming an IC as in claim 13, wherein forming the source/drain extension in step (b) comprises the steps of:
  i) selectively depositing a first doped oxide on said etched semiconductor surface, doped for a first device type;
  ii) selectively depositing a second doped oxide on said etched semiconductor surface, doped for a second device type; and
  iii) annealing with a rapid thermal anneal such that lateral junction depth is less than 100 Å.

17. A method of forming an IC as in claim 13, wherein the low resistance layer is a suicide layer and the step (c) of fanning the suicide layer comprises the steps of:
  i) forming a silicide layer on said semiconductor substrate;
  ii) forming a non conformal masking layer on said silicide layer;
  iii) removing portions of said masking layer from vertical suicide layer surfaces; and
  iv) removing exposed portions of said suicide layer.

18. A method of forming an IC as in claim 13, wherein said silicide layer is deposited using chemical vapor deposition (CYD) to deposit a 50–500 Å thick silicide layer at 250–500° C.

19. A method of forming an IC as in claim 13, wherein the low resistance layer is a metal layer and the step (c) of forming the metal layer comprises the steps of:
  i) forming a metal layer on said semiconductor substrate;
  ii) forming a non conformal masking layer on said metal layer;
  iii) removing portions of said masking layer from vertical metal layer surfaces; and
  iv) removing exposed portions of said metal layer.

20. A method of forming an IC as in claim 13, further comprising the step of:
  e) removing excess said low resistance layer material.

* * * * *